United States Patent
Park et al.

(10) Patent No.: US 10,629,832 B2
(45) Date of Patent: Apr. 21, 2020

(54) DISPLAY DEVICE AND MANUFACTURING METHOD THEREOF

(71) Applicant: Samsung Display Co. Ltd., Yongin-si (KR)

(72) Inventors: Jun Hong Park, Suwon-si (KR); Jung Soo Lee, Seoul (KR); Gwang Min Cha, Hwaseong-si (KR); Jeong Min Park, Seoul (KR)

(73) Assignee: SAMSUNG DISPLAY CO. LTD., Gyeonggi-Do (KR)

( * ) Notice: Subject to any disclaimer, the term of this patent is extended or adjusted under 35 U.S.C. 154(b) by 0 days.

(21) Appl. No.: 16/208,182

(22) Filed: Dec. 3, 2018

(65) Prior Publication Data

US 2019/0109289 A1 Apr. 11, 2019

Related U.S. Application Data

(63) Continuation of application No. 15/827,809, filed on Nov. 30, 2017, now Pat. No. 10,181,570.

(30) Foreign Application Priority Data

Jun. 13, 2017 (KR) ........................ 10-2017-0073882

(51) Int. Cl.
*H01L 51/10* (2006.01)
*H01L 27/12* (2006.01)
(Continued)

(52) U.S. Cl.
CPC ...... *H01L 51/105* (2013.01); *G02F 1/134336* (2013.01); *G02F 1/136227* (2013.01);
(Continued)

(58) Field of Classification Search
CPC . H01L 51/105; H01L 27/124; H01L 27/3248; H01L 27/3276; G02F 1/133345;
(Continued)

(56) References Cited

U.S. PATENT DOCUMENTS 8,377,614 B2 2/2013 Lee et al.
2005/0264740 A1* 12/2005 Yamazaki ......... G02F 1/133385
349/138
(Continued)

FOREIGN PATENT DOCUMENTS

JP  2014225527  12/2014
JP  2016167400  9/2016
KR  1020020083511  11/2002

*Primary Examiner* — Tu-Tu V Ho
(74) *Attorney, Agent, or Firm* — Cantor Colburn LLP

(57) ABSTRACT

A display device includes a substrate, a semiconductor layer disposed on the substrate, a first insulating layer disposed on the semiconductor layer, a first conductive layer disposed on the first insulating layer and electrically connected to the semiconductor layer via a first contact hole, which is defined through the first insulating layer, a second insulating layer disposed on the first conductive layer, and a second conductive layer disposed on the second insulating layer and electrically connected to the first conductive layer via a second contact hole, which is defined through the second insulating layer, where the first and second contact holes overlap each other, and a residual layer, which includes a portion of the second insulating layer, is disposed in the first contact hole.

16 Claims, 17 Drawing Sheets

(51) Int. Cl.
  *G02F 1/1362*    (2006.01)
  *G02F 1/1343*    (2006.01)
  *H01L 27/32*    (2006.01)
  *H01L 29/417*    (2006.01)
  *G02F 1/1337*    (2006.01)
  *G02F 1/1333*    (2006.01)

(52) U.S. Cl.
  CPC ...... *G02F 1/136286* (2013.01); *H01L 27/124* (2013.01); *H01L 27/3248* (2013.01); *H01L 29/41733* (2013.01); *G02F 1/133345* (2013.01); *G02F 1/133707* (2013.01); *G02F 1/136259* (2013.01); *H01L 27/3276* (2013.01)

(58) Field of Classification Search
  CPC ......... G02F 1/133707; G02F 1/134336; G02F 1/136227; G02F 1/136259; G02F 1/136286
  USPC ....................................................... 257/211
  See application file for complete search history.

(56) References Cited

U.S. PATENT DOCUMENTS

2017/0207253 A1\*   7/2017   Liu ................... H01L 27/1255
2018/0120658 A1\*   5/2018   Kanaya ............. G02F 1/133514

\* cited by examiner

DISPLAY DEVICE AND MANUFACTURING METHOD THEREOF

This application is a continuation of U.S. patent application Ser. No. 15/827,809, field on Nov. 30, 2017, which claims priority to Korean Patent Application No. 10-2017-0073882, filed on Jun. 13, 2017, and all the benefits accruing therefrom under 35 U.S.C. § 119, the content of which in its entirety is herein incorporated by reference.

BACKGROUND

1. Field

The disclosure relates to a display device and a manufacturing method of the display device.

2. Description of the Related Art

A display device typically includes a display panel having a plurality of pixels. The display device may be implemented as a liquid crystal display ("LCD") device, an organic light-emitting diode ("OLED") display device or the like, for example.

An LCD panel used in the LCD device may include two substrates having field-generating electrodes, such as a pixel electrode and a common electrode formed thereon, and a liquid crystal layer interposed between the two substrates. The LCD device applies voltages to the field-generating electrodes to generate an electric field in the liquid crystal layer to determine the alignment of liquid crystal molecules included in the liquid crystal layer, and controls the polarization of light incident thereupon, thereby displaying an image.

The OLED display device displays an image by using OLEDs, which generate light by recombining electrons and holes. Specifically, the OLED display device displays a desired image by applying a current corresponding to a particular gray level to OLEDs disposed in pixels, respectively.

Each of the pixels of the display device includes various wires and at least one thin-film transistor ("TFT"). In such a display device, the wires are placed in physical contact with one another via contact holes, which are defined insulating layers disposed between the wires, to electrically connect wires on different layers to each other.

SUMMARY

As the demand for high-resolution display devices has increased, a considerable number of pixels are desired to be formed within a given area. However, since there is a limit in minimizing the area occupied by each of the contact holes, there is also a limit in minimizing the area occupied by each of the pixels.

Accordingly, the contact holes may be formed in a superposed manner to minimize the area occupied by each of the contact holes. However, when the contact holes are formed in a superposed manner, the formation of upper contact holes may cause damage to lower contact holes or their neighboring areas. Therefore, a design or configuration of a display device for forming a plurality of contact holes in a superposed manner and minimizing damage to lower contact holes and their neighboring areas is desired.

Exemplary embodiments of the disclosure provide a display device in which a plurality of contact holes are formed in a superposed manner with minimized damage to lower contact holes and their neighboring areas.

Exemplary embodiments of the disclosure also provide a manufacturing method of a display device for forming a plurality of contact holes in a superposed manner and minimizing damage to lower contact holes and their neighboring areas.

According to an exemplary embodiment of the disclosure, a display device includes a substrate, a semiconductor layer disposed on the substrate, a first insulating layer disposed on the semiconductor layer, a first conductive layer disposed on the first insulating layer and electrically connected to the semiconductor layer via a first contact hole, which is defined through the first insulating layer, a second insulating layer disposed on the first conductive layer, and a second conductive layer disposed on the second insulating layer and electrically connected to the first conductive layer via a second contact hole, which is defined through the second insulating layer, where the first and second contact holes overlap each other, and a residual layer, which includes a portion of the second insulating layer, is disposed in the first contact hole.

According to another exemplary embodiment of the disclosure, a display device includes a substrate, a first conductive layer disposed on the substrate, a first insulating layer disposed on the conductive layer, a second conductive layer disposed on the first insulating layer and electrically connected to the first conductive layer via a first contact hole, which is defined through the first insulating layer, a second insulating layer disposed on the second conductive layer, and a third conductive layer disposed on the second insulating layer and electrically connected to the second conductive layer via a second contact hole, which is defined through the second insulating layer, where the first and second contact holes overlap each other, and a first residual layer, which includes a portion of the second insulating layer, is disposed in the first contact hole.

According to another exemplary embodiment of the disclosure, a manufacturing method of a display device includes providing a semiconductor layer on a substrate, providing a first insulating layer on the semiconductor layer, forming a first contact hole through the first insulating layer, providing a first conductive layer on the first insulating layer, providing a second insulating layer on the first conductive layer, forming a second contact hole through the second insulating layer to overlap the first contact hole in a way such that a portion of the second insulating layer remains in the first contact hole to form a residual layer, and providing a second conductive layer on the second insulating layer.

According to exemplary embodiments of the disclosure, a display device in which a plurality of contact holes are formed in a superposed manner with minimized damage to lower contact holes and their neighboring areas may be provided.

In such embodiment, a manufacturing method of a display device for forming a plurality of contact holes in a superposed manner and minimizing damage to lower contact holes and their neighboring areas may be provided.

Other features and exemplary embodiments may be apparent from the following detailed description, the drawings, and the claims.

BRIEF DESCRIPTION OF THE DRAWINGS

The above and other features of the disclosure will become more apparent by describing in detail exemplary embodiments thereof with reference to the attached drawings, in which.

DETAILED DESCRIPTION

Figure 1:
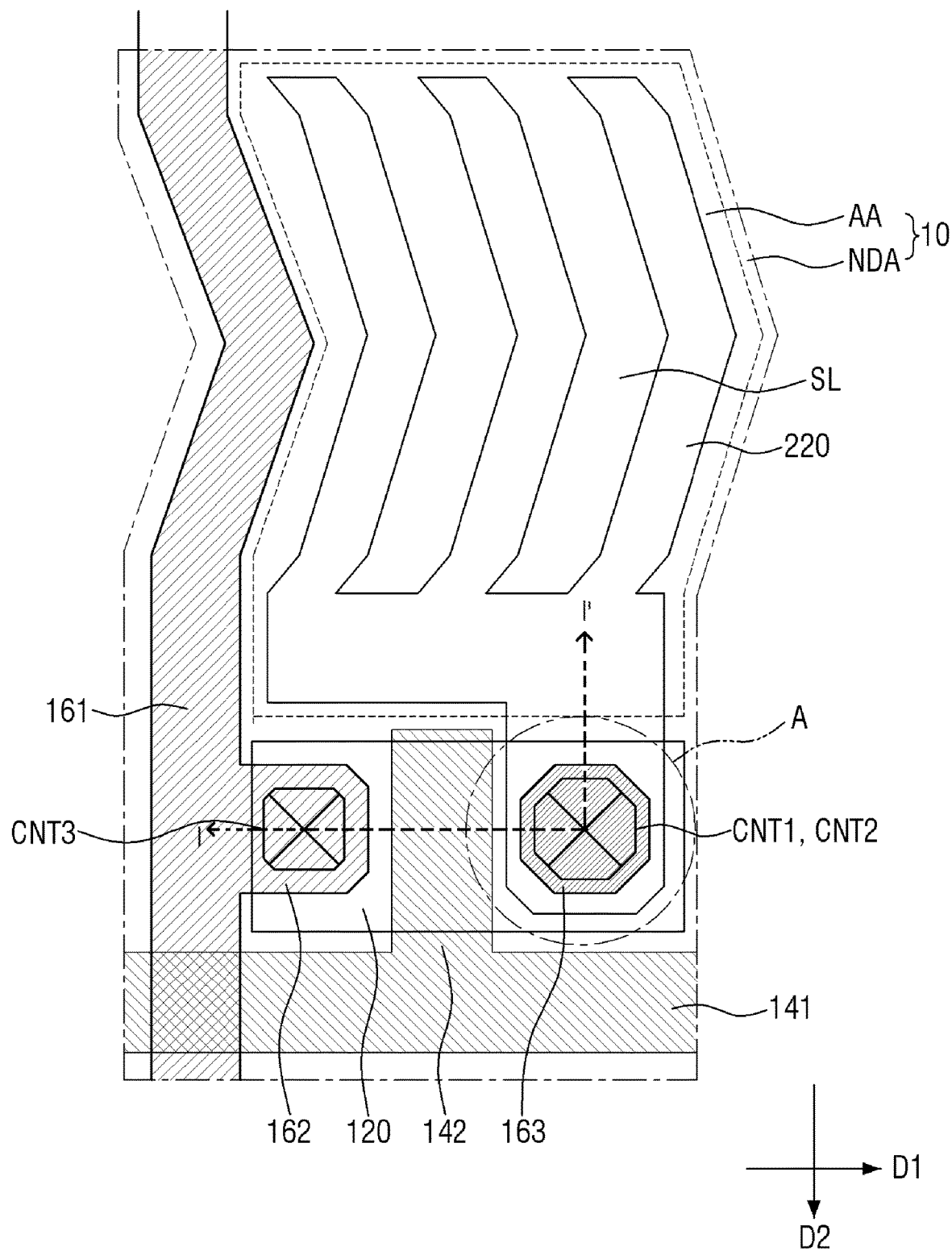
FIG. 1 is a schematic view of a pixel of a liquid crystal display ("LCD") device according to an exemplary embodiment of the disclosure.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
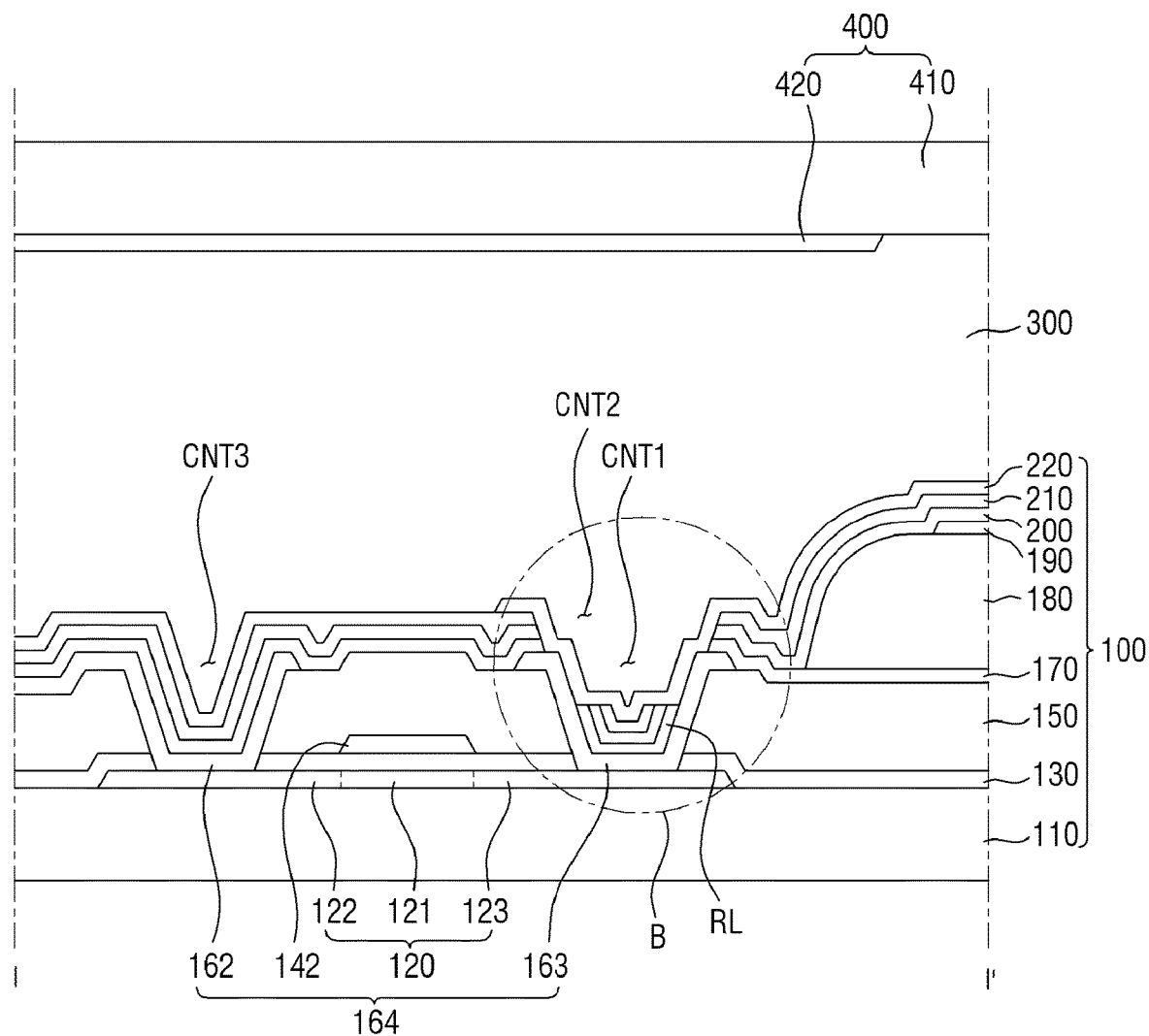
FIG. 2 is a cross-sectional view taken along line I-I' of FIG. 1.
Figure 3:
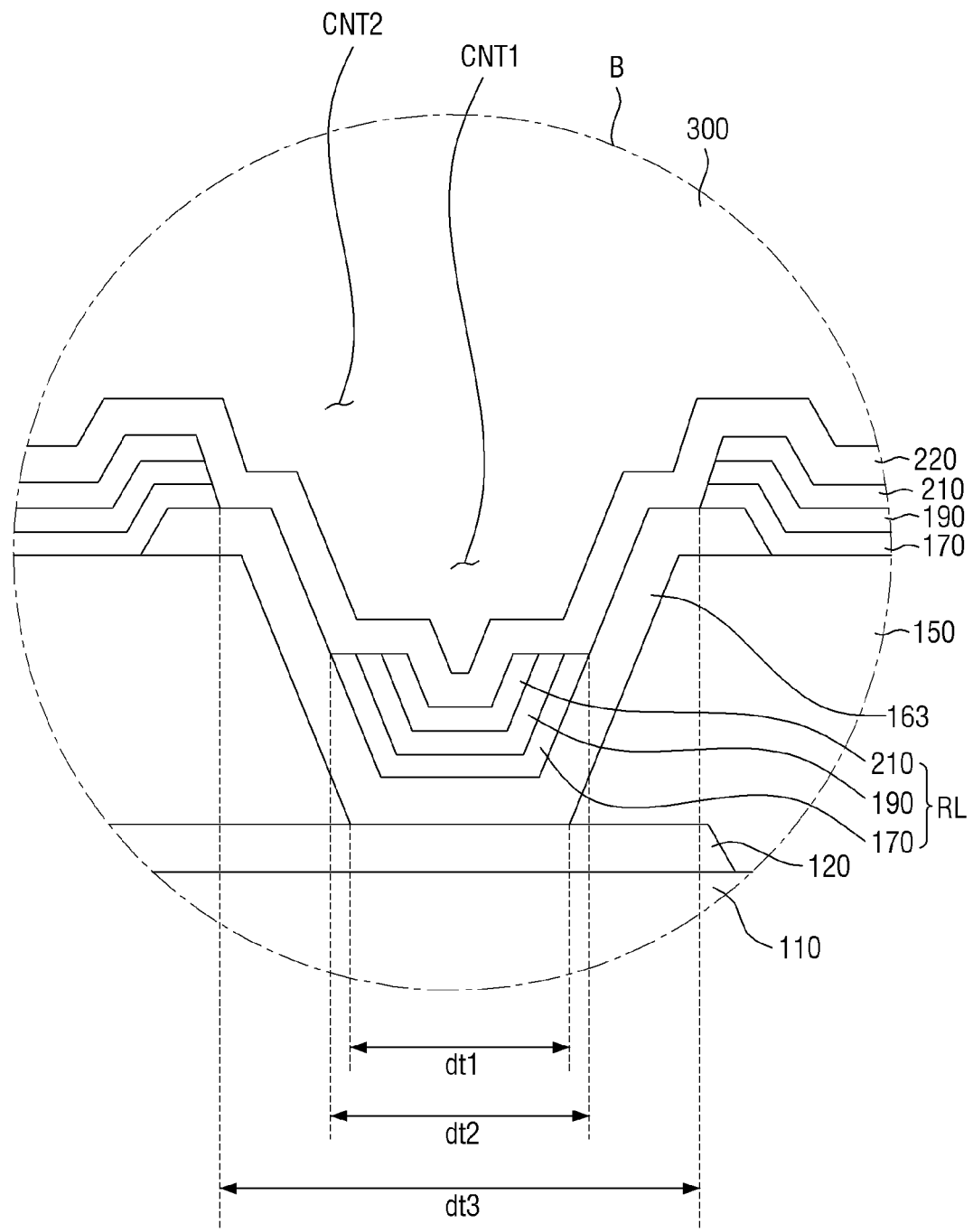
FIG. 3 is an enlarged plan view of an area B of FIG. 2.
Figure 4:
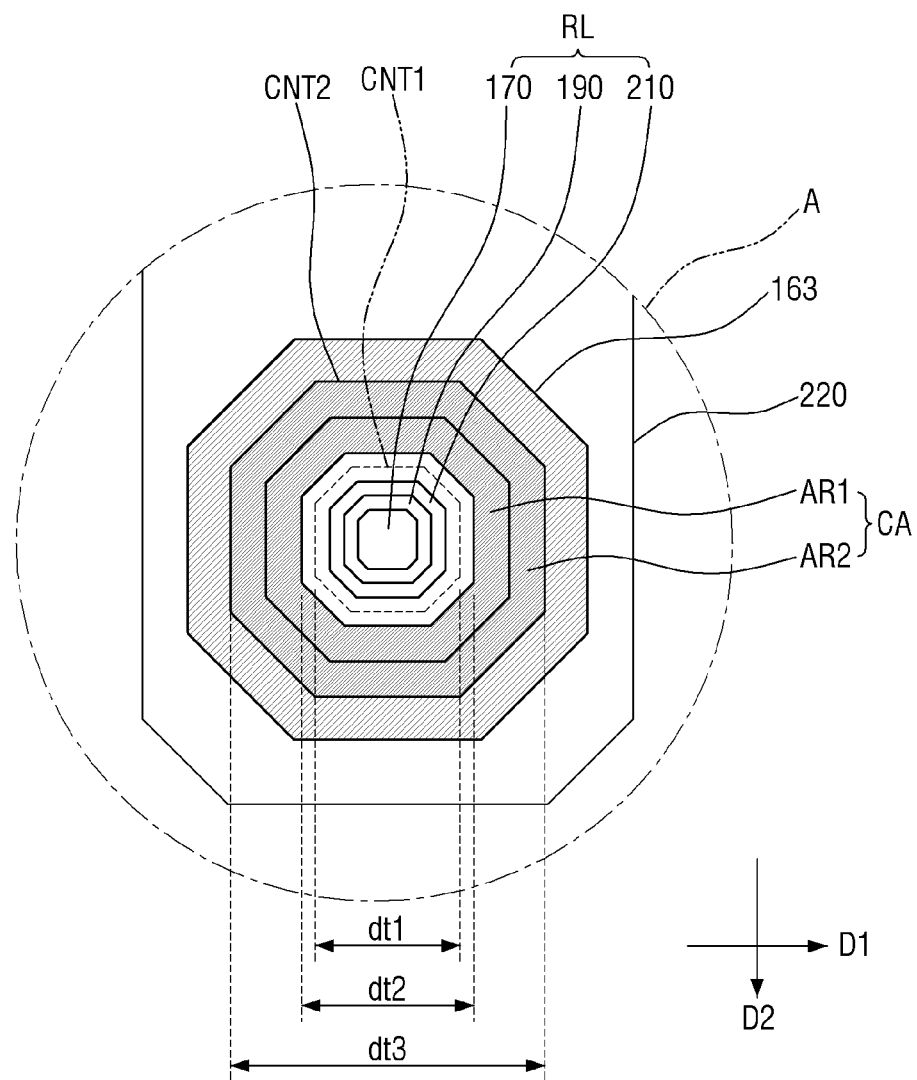
FIG. 4 is an enlarged cross-sectional view of an area A of FIG. 1.

FIG. 1 is a schematic view of a pixel of a liquid crystal display ("LCD") device according to an exemplary embodiment of the disclosure, FIG. 2 is a cross-sectional view taken along line I-I' of FIG. 1, FIG. 3 is an enlarged plan view of an area B of FIG. 2, and FIG. 4 is an enlarged cross-sectional view of an area A of FIG. 1.

Referring to FIGS. 1 through 4, an exemplary embodiment of the LCD device includes a first substrate 100, a second substrate 400, which is opposite to the first substrate 100, and a liquid crystal layer 300, which is interposed between the first and second substrates 100 and 400.

A switching element such as, for example, a thin-film transistor ("TFT") 164, is disposed on the first substrate 100 to control the orientation of liquid crystal molecules (not illustrated) included in the liquid crystal layer 300. The second substrate 400 is a substrate opposite to the first substrate 100.

The liquid crystal layer 300 is interposed between the first and second substrates 100 and 400 and may include a plurality of liquid crystal molecules having dielectric anisotropy. In response to an electric field being generated between the first and second substrates 100 and 400, the liquid crystal molecules may rotate in a particular direction between the first and second substrates 100 and 400 to allow or block the transmission of light. The term "rotation of liquid crystal molecules", as used herein, not only means actual rotation of the liquid crystal molecules, but also means change of the alignment of the liquid crystal molecules because of an electric field.

In an alternative exemplary embodiment of a display device, where the display device is a non-LCD display device such as, for example, an organic light-emitting diode ("OLED") display device, the second substrate 400 may be omitted. In such an embodiment, a thin encapsulation film may be provided to cover each of the elements on the first substrate 100, and the thin encapsulation film may serve as the second substrate 400.

In such an embodiment, the LCD device further includes a pixel 10, which is arranged in a matrix form with other pixels. The pixel 10 may operate, independently of the other pixels, based on a gray level corresponding to a single applied thereto, and may be a basic unit for displaying a particular color. The pixel 10 includes an active area AA, which is an area for displaying a color by transmitting therethrough light incident upon the bottom (e.g., a lower or outer surface) of the first substrate 100 to travel to the top (e.g., an upper or outer surface) of the second substrate 400. The remaining area of the pixel 10, other than the active area AA, may be a non-display area NDA.

In an exemplary embodiment of a display device, where the display device is a non-LCD display device such as, for example, an OLED display device, the display device may include the pixel 10, but no light may be incident upon the bottom of the first substrate 100. In an exemplary embodiment of the non-LCD display device, the pixel 10 may emit light having a particular color. In an exemplary embodiment of the non-LCD display device, an area in which a light-emitting layer (not illustrated) is disposed may be the active area AA, and an area in which the light-emitting layer is not disposed may be the non-display area NDA.

The first substrate 100 will hereinafter be described in detail.

In an exemplary embodiment, as shown in FIG. 2, the first substrate 100 includes a first base substrate 110. The first base substrate 110 may be a transparent insulating substrate. In one exemplary embodiment, for example, the first base substrate 110 may be a glass substrate, a quartz substrate, or a transparent resin substrate.

In an exemplary embodiment, the first substrate 100 may be curved in a predetermined direction. In an alternative exemplary embodiment, the first base substrate 110 may be flexible. In such an embodiment, the first base substrate 110 may be rollable, foldable, or bendable.

A semiconductor layer 120 is disposed on the first base substrate 110. The semiconductor layer 120 may include or be formed of a semiconductor material, and the conductivity of the semiconductor layer 120 may be determined by controlling the TFT 164. The semiconductor layer 120 includes a source region 122, a drain region 123, and a channel region 121, which is provided between the source region 122 and the drain region 123. The semiconductor layer 120 may include or be formed of at least one selected from amorphous silicon, an oxide semiconductor, and low-temperature polysilicon ("LTPS"). Part of the semiconductor layer 120 may overlap not only a gate electrode 142, which will be described later in greater detail, but also a source electrode 162 and a drain electrode 163, which will be described later in greater detail. Herein, the term "overlap" means "overlaps when viewed from a top plan view" or "overlap in a thickness direction of the first base substrate 110."

Although not specifically illustrated, in some exemplary embodiments, ohmic contact members may be additionally disposed on the semiconductor layer 120. The ohmic contact members may include or be formed of n+ hydrogenated amorphous silicon doped with a high concentration of n-type impurities, or may include or be formed of silicide. The ohmic contact members may be disposed on the semiconductor layer 120 in a pair. The ohmic contact members may be disposed between the source electrode 162, the drain electrode 163 and the semiconductor layer 120 to allow the source electrode 162, the drain electrode 163 and the semiconductor layer 120 to have ohmic contact characteristics. In an exemplary embodiment where the semiconductor layer 120 includes an oxide semiconductor, the ohmic contact members may be omitted.

A buffer layer (not illustrated) may be additionally disposed between the first substrate 100 and the semiconductor layer 120.

A first insulating layer 130 is disposed on the semiconductor layer 120. The first insulating layer 130 separates the gate electrode 142, which is disposed on the first insulating layer 130, and the semiconductor layer 120 from each other. The first insulating layer 130 may include or be formed of an insulating material such as, for example, silicon nitride or silicon oxide. The first insulating layer 130 may have a single-layer structure. Alternatively, the first insulating layer 130 may have a multilayer structure including two insulating films having different physical properties from each other.

A gate line 141 and the gate electrode 142 are disposed on the first insulating layer 130.

The gate line 141 transmits a gate voltage, which controls the TFT 164. The gate line 141 may extend in a first direction D1.

The first direction D1 may be a direction represented by an arbitrary straight line extending over a plane where the first base substrate 110 is disposed. Specifically, the first direction D1 may be an arbitrary direction perpendicular to a second direction D2, which will be described later. In an exemplary embodiment, as shown in FIGS. 1 through 4, a direction represented by an arbitrary straight line extending from the left to the right of FIG. 1 may be the first direction D1.

The gate voltage is provided by an external source and may have a variable voltage level. The TFT 164 may be turned on or off based on the level of the gate voltage.

The gate electrode 142 may protrude from the gate line 141 and may be physically connected to the gate line 141. The gate electrode 142 is disposed to overlap a part of the semiconductor layer 120 and may be an element of the TFT 164, which will be described later. However, the shape of the gate electrode 142 is not particularly limited, and the gate electrode 142 may have one of various shapes other than that illustrated in FIGS. 1 through 4. In one exemplary embodiment, for example, a part of the gate line 141 may define the gate electrode 142.

The gate line 141 and the gate electrode 142 may include or be formed of a same material as each other. In one exemplary embodiment, for example, the gate line 141 and the gate electrode 142 may include or be formed of an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), tantalum (Ta), or titanium (Ti). The gate line 141 and the gate electrode 142 may have a single-layer structure or a multilayer structure including at least two conductive films having different physical properties from each other.

A second insulating layer 150 is disposed on the gate line 141 and the gate electrode 142. The second insulating layer 150 may include or be formed of an insulating material. In one exemplary embodiment, for example, the second insulating layer 150 may include or be formed of a silicon nitride or a silicon oxide. The second insulating layer 150 may have a single-layer structure or a multilayer structure including two insulating films having different physical properties from each other.

A data line 161, the source electrode 162 and the drain electrode 163 are disposed on the second insulating layer 150.

The data line 161 may extend in the second direction D2 and may intersect the gate line 141. The second direction D2 may be a direction represented by an arbitrary straight line extending perpendicularly to the first direction D1 over the plane where the first base substrate 110 is disposed.

The data line 161 may be insulated from the gate line 141 and the gate electrode 142 by the second insulating layer 150.

The data line 161 may provide a data voltage to the source electrode 162. The data voltage may be provided by an external source and may have a variable voltage level. The gray level of the pixel 10 may change in accordance with the level of the data voltage applied to the pixel 10.

The source electrode 162 is branched off from the data line 161 and at least partially overlaps the gate electrode 142.

Referring to FIG. 1, the source electrode 162 and the drain electrode 163 are spaced apart from each other with the gate electrode 142 interposed therebetween. The source electrode 162 provides the data voltage provided via the data line 161 to the source region 122 of the semiconductor layer 120. The semiconductor layer 120 may transmit the data voltage provided to the source region 122 to the drain region 123 via the channel region 121 (only when the gate voltage has an "on" level). The drain electrode 163 may receive the data voltage from the drain region 123 of the semiconductor layer 120 and may provide the received data voltage to a pixel electrode 220, which will be described later. The connection between the source electrode 162, the semiconductor layer 120, the drain electrode 163 and the pixel electrode 220 will be described later in detail.

The data line 161, the source electrode 162 and the drain electrode 163 may include or be formed of a same material as each other. In one exemplary embodiment, for example, the data line 161, the source electrode 162 and the drain electrode 163 may include or be formed of Al, Cu, Ag, Mo, Cr, Ti, Ta, or an alloy thereof. The data line 161, the source electrode 162 and the drain electrode 163 may have a multilayer structure including a lower film (not illustrated) formed of a refractory metal and a low-resistance upper film (not illustrated) on the lower film, but the disclosure is not limited thereto.

The gate electrode 142, the semiconductor layer 120, the source electrode 162 and the drain electrode 163 may collectively define the TFT 164, which is a switching element of the pixel 10.

The source electrode 162 and the drain electrode 163 are electrically connected to the source region 122 and the drain region 123, respectively, of the semiconductor layer 120 via contact holes, which are defined through (e.g., formed to penetrate) the second insulating layer 150. In an exemplary embodiment, the source electrode 162 is disposed along the inner sidewalls of a third contact hole CNT3, which is defined through the second insulating layer 150, to be placed in physical contact with, and electrically connected to, the source region 122 of the semiconductor layer 120. The drain electrode 163 is disposed along the inner sidewalls of a first contact hole CNT1, which is defined through the second insulating layer 150, to be placed in physical contact with, and electrically connected to, the drain region 123 of the semiconductor layer 120.

A residual layer RL is disposed on the inside of the first contact hole CNT1, e.g., on the inside of the drain electrode 163, which is disposed along the inner sidewalls of the first contact hole CNT1. The residual layer RL includes portions of third, fourth and fifth insulating layers 170, 190 and 210, which will be described later.

The third insulating layer 170 is disposed on the data line 161, the source electrode 162 and the drain electrode 163. The third insulating layer 170 may prevent the material of a color filter layer 180, which is disposed on the third insulating layer 170, from infiltrating into layers below the third insulating layer 170. The third insulating layer 170 may include or be formed of an insulating material such as, for example, silicon nitride or silicon oxide. The third insulating layer 170 may have a single-layer structure or a multilayer structure including two insulating films having different physical properties from each other.

The color filter layer 180 is disposed on the third insulating layer 170.

The color filter layer 180 may include a photosensitive organic composition containing a pigment for realizing a color, and may have one of red, green and blue pigments. In one exemplary embodiment, for example, the color filter layer 180 may include a plurality of color filters. Each of the plurality of color filters may display one of three primary colors such as red, green and blue colors, for example, but the disclosure is not limited thereto. Alternatively, each of the plurality of color filters may display one of cyan, magenta, yellow and white colors.

The fourth insulating layer 190 is disposed on the color filter layer 180.

The fourth insulating layer 190 may prevent the material of the color filter layer 180 from infiltrating into layers above the fourth insulating layer 190. The fourth insulating layer 190 may include or be formed of an insulating material such as, for example, a silicon nitride or a silicon oxide. The fourth insulating layer 190 may have a single-layer structure. Alternatively, the fourth insulating layer 190 may have a multilayer structure including two insulating films having different physical properties from each other.

A common electrode 200 is disposed on the fourth insulating layer 190.

The common electrode 200 may include or be formed of a transparent conductive material such as indium tin oxide ("ITO"), indium zinc oxide ("IZO"), indium tin zinc oxide ("ITZO"), or Al-doped zinc oxide ("AZO").

The common electrode 200 may be in the pixel 10 in the form of a plate. A common voltage, which is provided by an external source, is applied to the common electrode 200, and as a result, the common electrode 200 may generate an electric field in the liquid crystal layer 300 together with the pixel electrode 220, which will be described later.

The common voltage may be provided by an external source, and may be uniformly maintained while the LCD device is operating. Accordingly, an electric field is generated in the surroundings of the pixel electrode 220 and the common electrode 200, which are disposed to overlap each other, due to a difference between the data voltage applied to the pixel electrode 220 and the common voltage applied to the common electrode 200, and as a result, the liquid crystal molecules included in the liquid crystal layer 300 may rotate or may be tilted.

The fifth insulating layer 210 is disposed on the common electrode 200.

The fifth insulating layer 210 may maintain a predetermined distance between the common electrode 200, which is disposed above the fifth insulating layer 210, and the pixel electrode 220, which is disposed above the fifth insulating layer 210, so that the common electrode 200 and the pixel electrode 220 are not physically connected to each other. The fifth insulating layer 210 may include or be formed of an insulating material such as, for example, a silicon nitride or a silicon oxide. The fifth insulating layer 210 may have a single-layer structure. Alternatively, the fifth insulating layer 210 may have a multilayer structure including two insulating films having different physical properties from each other.

The pixel electrode 220 is disposed on the fifth insulating layer 210.

The pixel electrode 220 may be physically connected to the drain electrode 163 via a second contact hole CNT2 and may receive the data voltage from the drain electrode 163.

The pixel electrode 220 may include or be formed of a transparent conductive material such as ITO, IZO, ITZO, or AZO.

The pixel electrode 220 may be disposed substantially within the active area AA and may include an extended area to overlap the second contact hole CNT2 for connection to the drain electrode 163.

The pixel electrode 220 may include, in the active area AA, a fine slit SL, which is an area in which the transparent conductive material of the pixel electrode 220 is not disposed or removed, and may have a particular pattern. In one exemplary embodiment, for example, the pixel electrode 220 may be arranged to form a "V" shape, as illustrated in FIG. 1. However, the shape of the pixel electrode 220 is not particularly limited, and the pixel electrode 220 may have various shapes other than a "V" shape. Alternatively, the pixel electrode 220 may be formed as a plate with no fine slit SL.

The pixel electrode 220 is electrically connected to the drain electrode 163 via the second contact hole CNT2, which is defined through the third, fourth and fifth insulating layers 170, 190 and 210. Specifically, the pixel electrode 220 may be disposed along the inner sidewalls of the second contact hole CNT2, which is defined through the third, fourth, and fifth insulating layers 170, 190 and 210, and may thus be in physical contact with, and electrically connected to, the drain electrode 163.

The second contact hole CNT2 is disposed to overlap the first contact hole CNT1. Since the first and second contact holes CNT1 and CNT2 are disposed to overlap each other, the area occupied by the first and second contact holes CNT1 and CNT2 may be minimized, as compared to a case where the first and second contact holes CNT1 and CNT2 are disposed not to overlap each other, and as a result, a high-resolution display device may be effectively realized.

In an exemplary embodiment, a region where the pixel electrode 220 and the drain electrode 163 are placed in physical contact may have an annular shape with an opening at a center thereof, as viewed from a top of the first base substrate 110. In such an embodiment, the pixel electrode 220 and the drain electrode 163 form a ring contact. The ring contact may be defined as a contact with a ring-shaped opening at a center thereof, formed in a region where two elements are in contact with each other.

In such an embodiment, the region where the pixel electrode 220 and the drain electrode 163 are in physical contact (also referred to as a contact area CA) includes a first area AR1 and a second area AR2. The first area AR1 is an area on the inner side of the region where the pixel electrode 220 and the drain electrode 163 are in physical contact, and the second area AR2 may be an area surrounding the first area AR1. The first area AR1 corresponds to the inner sidewalls of the first contact hole CNT1 where the drain electrode 163 and the pixel electrode 220 are in contact with each other, and the second area AR2 corresponds to an area on the outside of the first contact hole CNT1 where the drain electrode 163 and the pixel electrode 220 are in contact with each other.

The ring contact may be formed by arranging the residual layer RL, which includes portions of the third, fourth and fifth insulating layers 170, 190, and 210, in the first contact hole CNT1 near the center of the first contact hole CNT1.

In an exemplary embodiment, the residual layer RL, which is disposed in the first contact hole CNT1, may be formed by controlling the amount of exposure to leave some of photoresist (not illustrated) used to form the second contact hole CNT2 inside the second contact hole CNT2 after exposure and development. In such an embodiment, by controlling the amount of exposure, the first and second contact holes CNT1 and CNT2 may be formed to overlap each other without causing any defects in the first contact hole CNT1. This will be described later in greater detail along with an exemplary embodiment of a manufacturing method of the LCD device shown in FIGS. 1 through 4.

A width dt1 of the first contact hole CNT1 may be smaller than a width dt2 of the residual layer RL, but the disclosure is not limited thereto. That is, alternatively, the width dt2 of the residual layer RL may be smaller than the width dt1 of the first contact hole CNT1. In such an embodiment, the width dt2 of the residual layer RL may be determined regardless of the width dt1 of the first contact hole CNT1. As the duration of exposure performed on the photoresist used to form the second contact hole CNT2 increases, the width dt2 of the residual layer RL may decrease, and this will be described later.

The width dt1 of the first contact hole CNT1 may refer to the width of the region of contact between the drain electrode 163 and the semiconductor layer 120, which is disposed below the drain electrode 163, and the width dt2 of the residual layer RL may refer to a measurement of the width of the residual layer RL as viewed from the top of the residual layer RL.

The width dt2 of the residual layer RL may be the same as the width of the opening of the ring contact because the opening of the ring contact is formed by the residual layer RL.

The width dt3 of the second contact hole CNT2 may be greater than the width dt1 of the first contact hole CNT1 and the width dt2 of the residual layer RL. The width dt3 of the second contact hole CNT2 may refer to the width of the region of contact between the pixel electrode 220 and the drain electrode 163, which is disposed below the pixel electrode 220. The width dt3 of the second contact hole CNT2 may be the same as the width of the entire ring contact.

The residual layer RL may have a same stack structure as a stack of the layers disposed between the pixel electrode 220 and the drain electrode 163, which are physically and electrically connected via the second contact hole CNT2, or may have fewer layers than the stack of the layers disposed between the pixel electrode 220 and the drain electrode 163. In an exemplary embodiment, as shown in FIG. 3, the residual layer RL may have a structure in which the third, fourth and fifth insulating layers 170, 190 and 210 are sequentially stacked one on another, but the disclosure is not limited thereto. That is, alternatively, the residual layer RL may have a structure in which only the third and fourth insulating layers 170 and 190 are stacked or a structure in which only the third insulating layer 170 is stacked. Some of the layers disposed between the pixel electrode 220 and the drain electrode 163 may be omitted from the residual layer RL.

In an embodiment where the top surface of the residual layer RL is not flat, the top of the residual layer RL reflects a height difference inside the first contact hole CNT1. In such an embodiment, the residual layer RL may have the same stack structure as the stack of the layers disposed between the pixel electrode 220 and the drain electrode 163. Accordingly, in such an embodiment where the top of the residual layer RL is not flat, the residual layer RL may have a structure in which all of the third, fourth and fifth insulating layers 170, 190 and 210 are stacked one on another.

The width dt3 of the second contact hole CNT2 may be about 1.5 micrometers (μm) or less. However, the width dt3 of the second contact hole CNT2 is not particularly limited and may vary depending on the limit resolution of exposure equipment.

The second substrate 400 will hereinafter be described in detail.

The second substrate 400 includes a second base substrate 410 and a light-shielding member 420.

The second base substrate 410 is disposed to face the first base substrate 110. The second base substrate 410 may be durable enough to withstand an external impact. The second base substrate 410 may be a transparent insulating substrate. In one exemplary embodiment, for example, the second base substrate 410 may be a glass substrate, a quartz substrate, or a transparent resin substrate. The second base substrate 410 may be flat or may be curved in a particular direction.

The light-shielding member 420 is disposed on a surface (e.g., a lower or inner surface) of the second base substrate 410 that faces the first substrate 100. The light-shielding member 420 may be disposed to overlap the gate line 141, the data line 161, the TFT 164, the first contact hole CNT1, the second contact hole CNT2 and the third contact hole CNT3, i.e., to overlap the non-display area NDA, which is an area other than the active area AA. The light-shielding member 420 may block the transmission of light in an area other than the active area AA.

The liquid crystal layer 300 will hereinafter be described.

The liquid crystal layer 300 includes a plurality of liquid crystal molecules having dielectric anisotropy and refractive anisotropy. The liquid crystal molecules may be aligned in a vertical direction with respect to the first and second substrates 100 and 400 in the absence of an electric field in the liquid crystal layer 300. In response to an electric field being generated between the first and second substrates 100 and 400, the liquid crystal molecules may rotate or may be tilted in a particular direction between the first and second substrates 100 and 400, thereby changing the polarization of light.

The structures of two overlapping contact holes, i.e., the first and second contact holes CNT1 and CNT2, which are defined to overlap each other, have been described above with reference to FIGS. 1 through 4. In an exemplary embodiment, as shown in FIGS. 1 through 4, the first and second contact holes CNT1 and CNT2 may be connected by the semiconductor layer 120, the drain electrode 163 and the pixel electrode 220, but the disclosure is not limited thereto. That is, any three elements that flow a current therethrough either temporarily or continuously may be electrically connected via two overlapping contact holes regardless of whether the elements are semiconductors or conductors. In an exemplary embodiment, as shown in FIGS. 1 through 4, the pixel having the overlapping contact hole structure is a pixel of an LCD device, but the disclosure is not limited thereto. Alternatively, the pixel having the overlapping contact hole structure is a pixel of an OLED display device.

As described above with reference to FIGS. 1 through 4, the pixel may have a structure with two overlapping contact holes, but the disclosure is not limited thereto. In an alternative embodiment, the pixel may have a structure with three overlapping contact holes. In one exemplary embodiment, for example, three contact holes are disposed to overlap one another, and three conductive layers are electrically connected to one another with a total of two insulating layers interposed therebetween, where a part of the lower insulating layer may remain in the lowermost contact hole and a part of the upper insulating layer may remain in the second lowermost contact hole.

Hereinafter, an exemplary embodiment of a method of fabricating the first and second contact holes CNT1 and CNT2, which overlapping each other, will be described in detail.

FIGS. 5 through 13 are cross-sectional views illustrating an exemplary embodiment of a manufacturing method of the LCD device of FIGS. 1 through 4.

Specifically, FIGS. 5 through 13 are cross-sectional views taken along line I-I' of FIG. 1.

Figure 5:
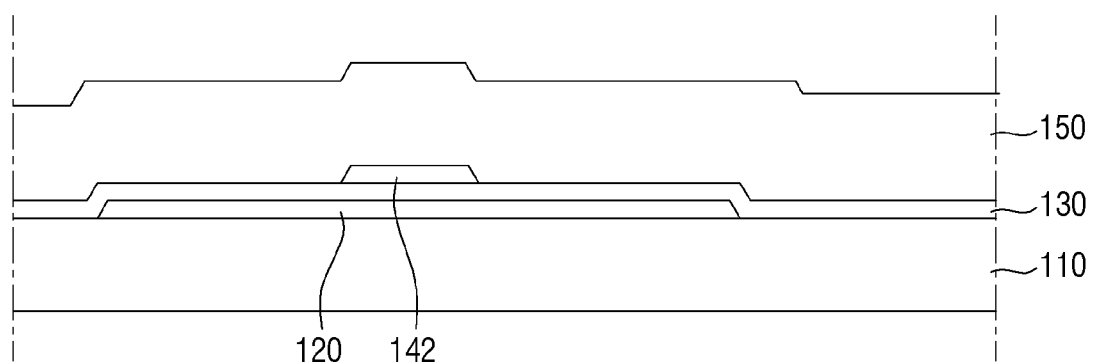
FIGS. 5 through 13 are cross-sectional views illustrating an exemplary embodiment of a manufacturing method of the LCD device of FIGS. 1 through 4.

Referring to FIG. 5, the semiconductor layer 120 is provided, e.g., formed, on the first base substrate 110. Thereafter, the first insulating layer 130 is provided on the semiconductor layer 120, and the gate electrode 142 is provided on the first insulating layer 130. Thereafter, the second insulating layer 150 is provided on the first insulating layer 130 to cover the semiconductor layer 120 and the gate electrode 142.

Figure 6:
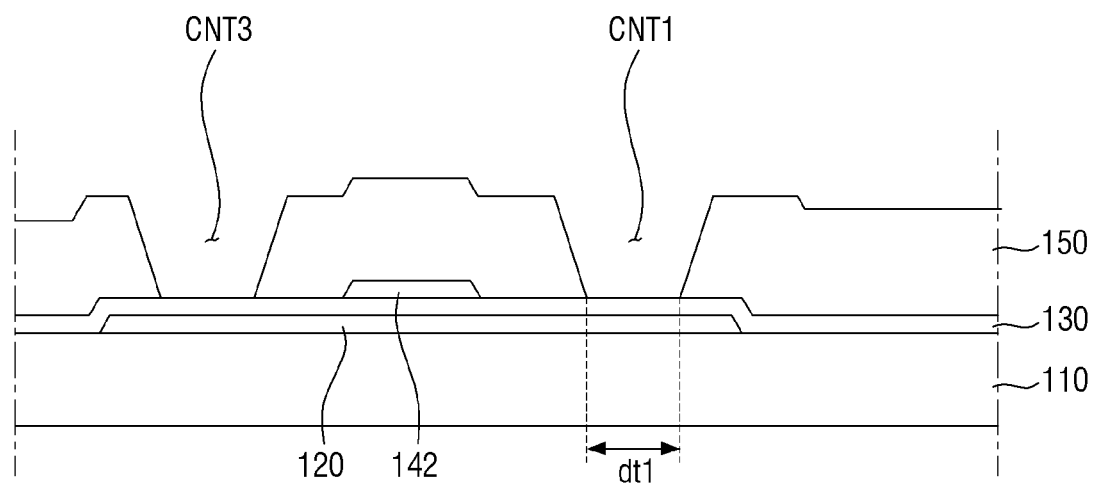

Thereafter, referring to FIG. 6, the first and third contact holes CNT1 and CNT3 are formed through the second insulating layer 150. The width dt1 of the first contact hole CNT1 may be the same as the limit resolution of exposure equipment.

Figure 7:
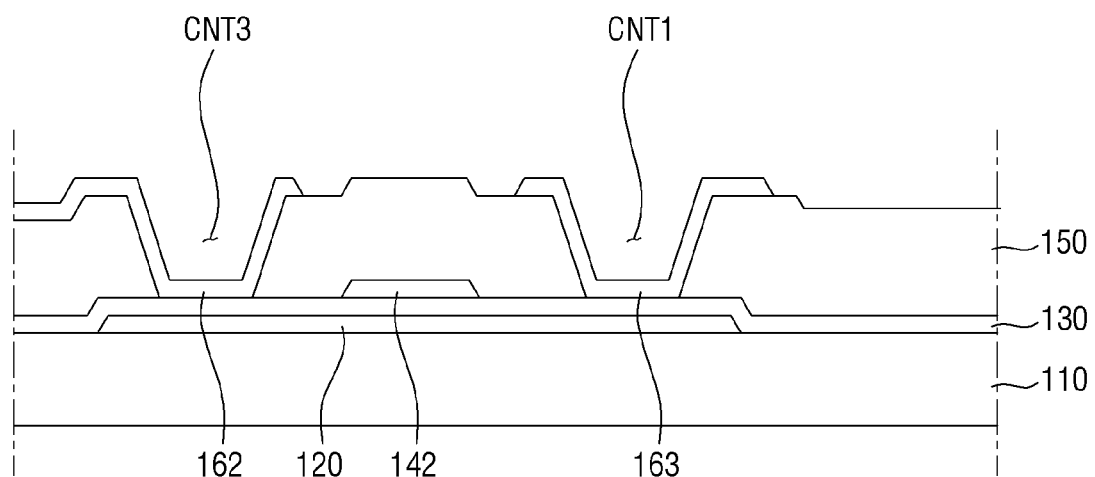

Thereafter, referring to FIG. 7, the data line 161, the drain electrode 163 and the source electrode 162 are provided on the second insulating layer 150 and inside the first and third contact holes CNT1 and CNT3.

Figure 8:
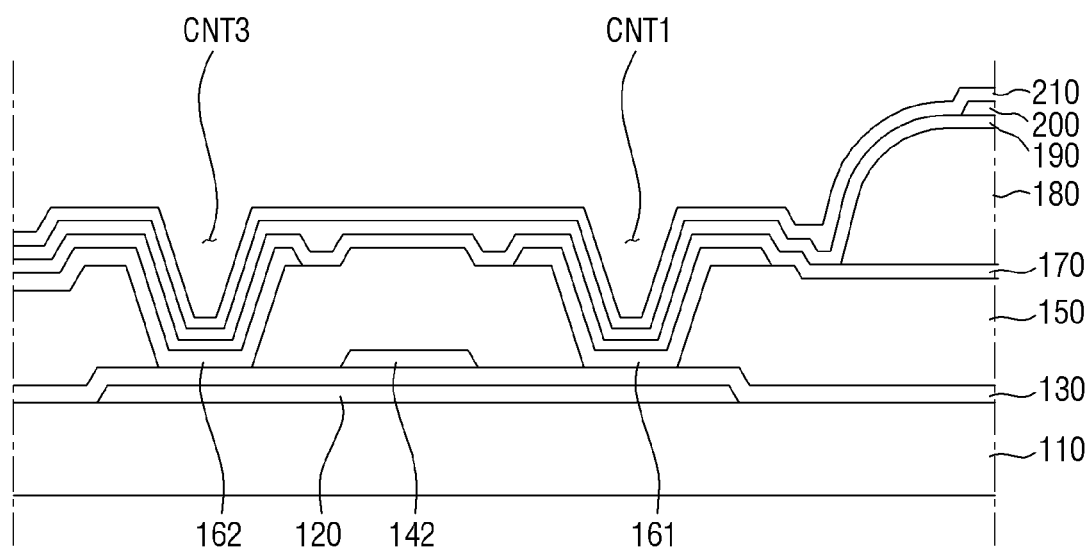

Thereafter, referring to FIG. 8, the third, fourth and fifth insulating layers 170, 190, and 210 are provided on the data line 161, the drain electrode 163 and the source electrode 162. In such an embodiment, the common electrode 200 is provided between the fourth and fifth insulating layers 190 and 210.

Since the second contact hole CNT2 is yet to be formed, the third, fourth and fifth insulating layers 170, 190 and 210 may overlap a region where the first contact hole CNT1 is disposed.

The formation of the second contact hole CNT2 will hereinafter be described with reference to FIGS. 9 through 13.

Figure 9:
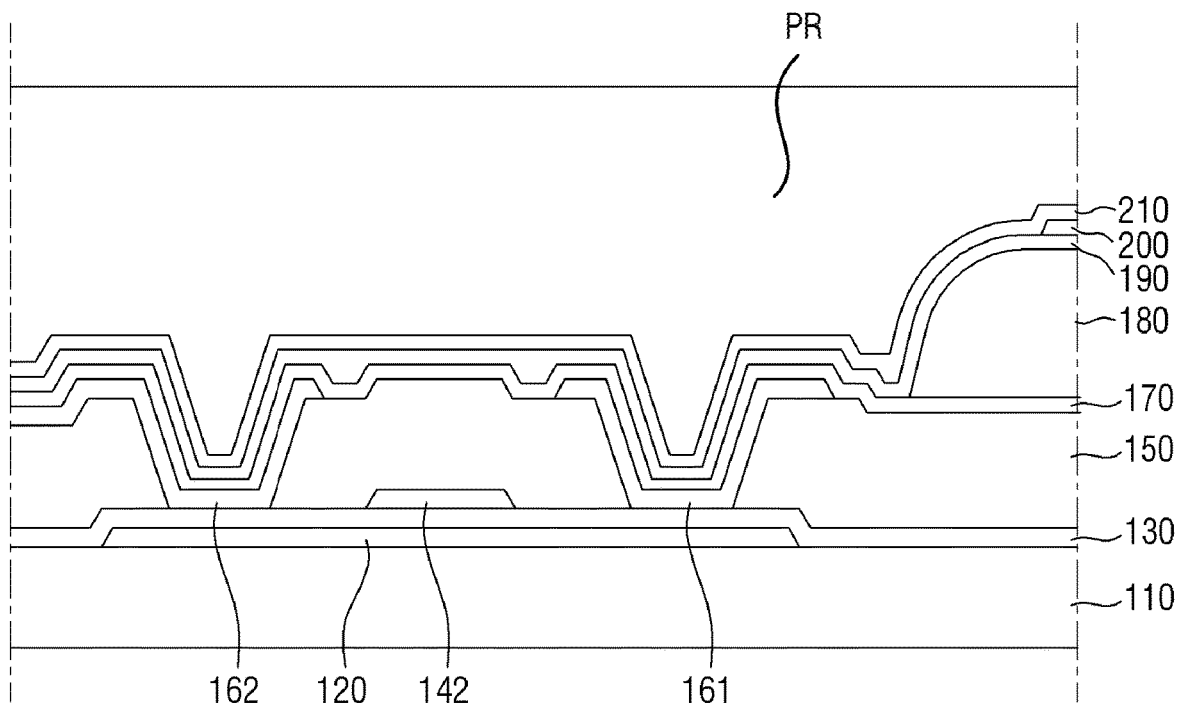

Referring to FIG. 9, photoresist PR is applied on the fifth insulating layer 210.

Figure 10:
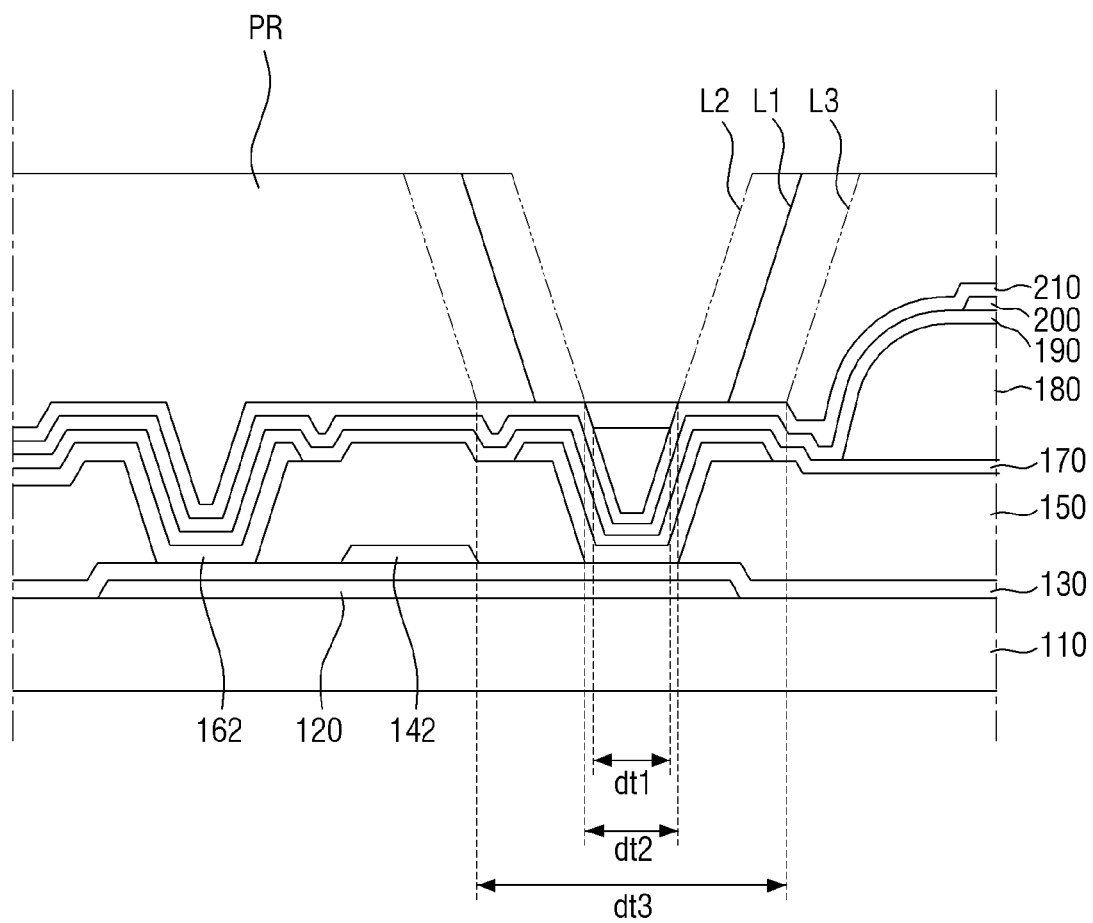

Thereafter, referring to FIG. 10, the photoresist PR is removed from a region where the second contact hole CNT2 is to be formed, by exposing the photoresist PR to ultraviolet ("UV") light and developing the photoresist PR.

Referring to FIG. 10, an opening L2 is an opening that may be obtained by exposing and developing the photoresist PR with the limit resolution of exposure equipment, as performed in the formation of the first contact hole CNT1. If the photoresist PR is exposed and developed to have the opening L2, the third, fourth and fifth insulating layers 170, 190 and 210 may not be properly removed from the first contact hole CNT1 because of too much of the photoresist PR remaining in the first contact hole CNT1. Thus, an additional exposure process may be.

If the additional exposure process is excessively performed, an opening L3 may be formed in the photoresist PR. However, since a width dt3 of the opening L3 may be larger than the width of the area covered by the drain electrode 163, the third, fourth and fifth insulating layers 170, 190 and 210 may be damaged or may be removed even from regions (on the outside of the drain electrode 163) where the third, fourth and fifth insulating layers 170, 190 and 210 are not desired to be removed. As a result, the pixel electrode 220 may not be properly formed.

In an exemplary embodiment, the photoresist PR is exposed and developed to have an opening L1, the third, fourth and fifth insulating layers 170, 190 and 210 may be removed to the extent that the ring contact may be formed even though some of the photoresist PR still remains in the first contact hole CNT1. Accordingly, damage to the third, fourth and fifth insulating layers 170, 190 and 210 on the outside of the drain electrode 163 may be minimized, and the semiconductor layer 120 and the pixel electrode 220 may be smoothly connected physically and electrically. In such an embodiment, a maximum width of the photoresist PR remaining in the first contact hole CNT1 may be smaller than the width dt1 of the first contact hole CNT1.

Figure 11:
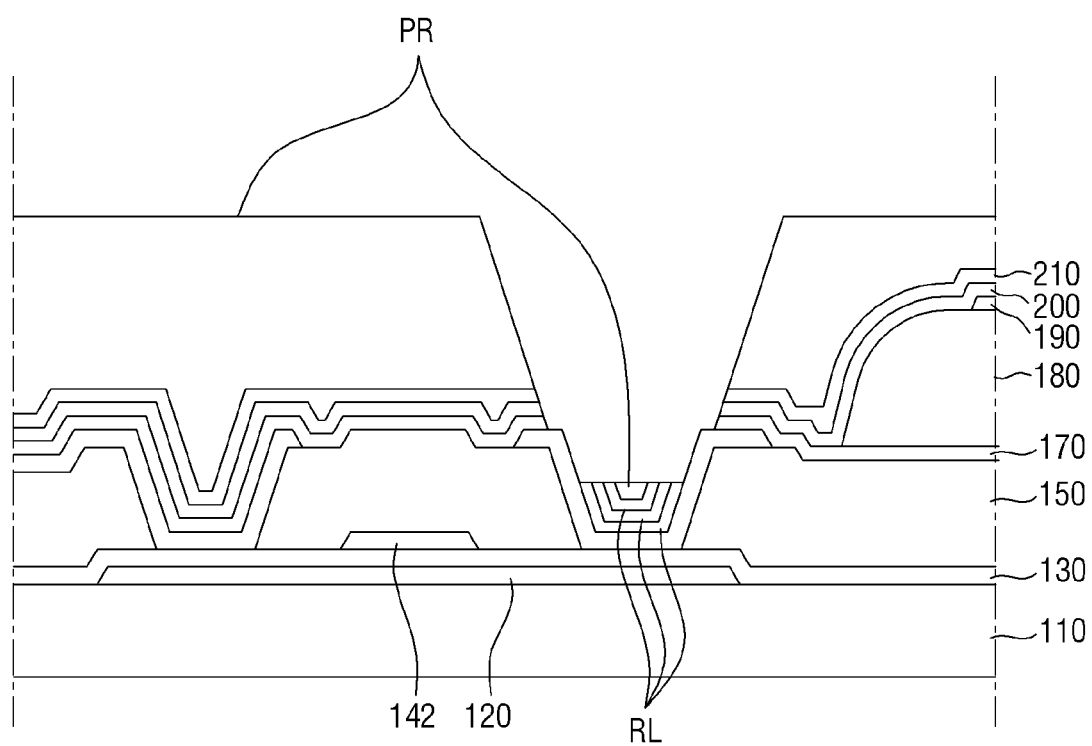

Thereafter, referring to FIG. 11, portions of the third, fourth and fifth insulating layers 170, 190 and 210 that are exposed by the opening L1 of the photoresist PR are etched away.

Figure 12:
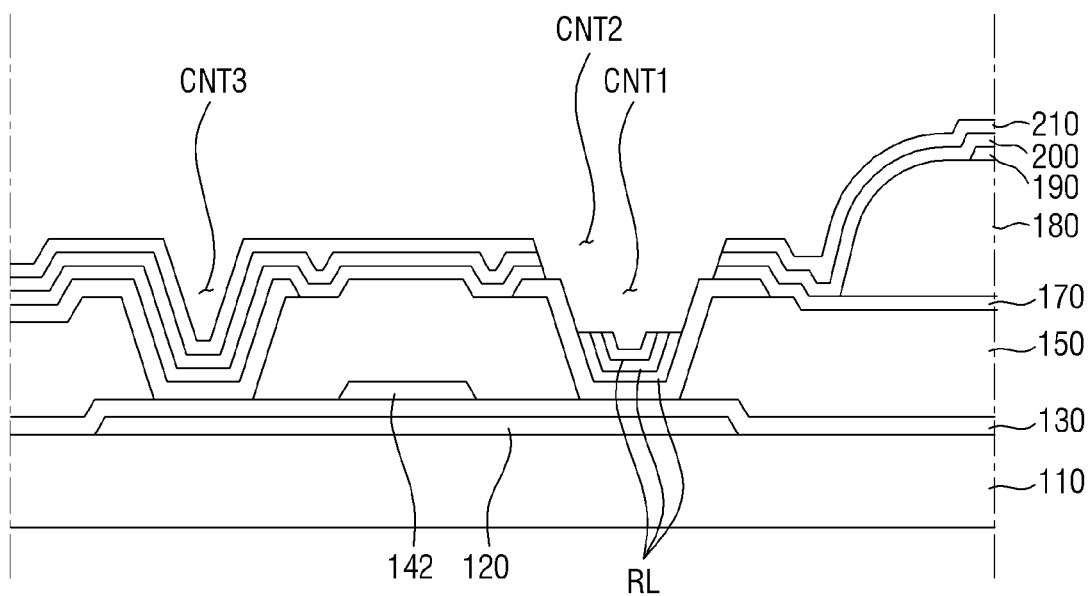

Thereafter, referring to FIG. 12, the remaining portion of the photoresist PR is entirely removed.

Figure 13:
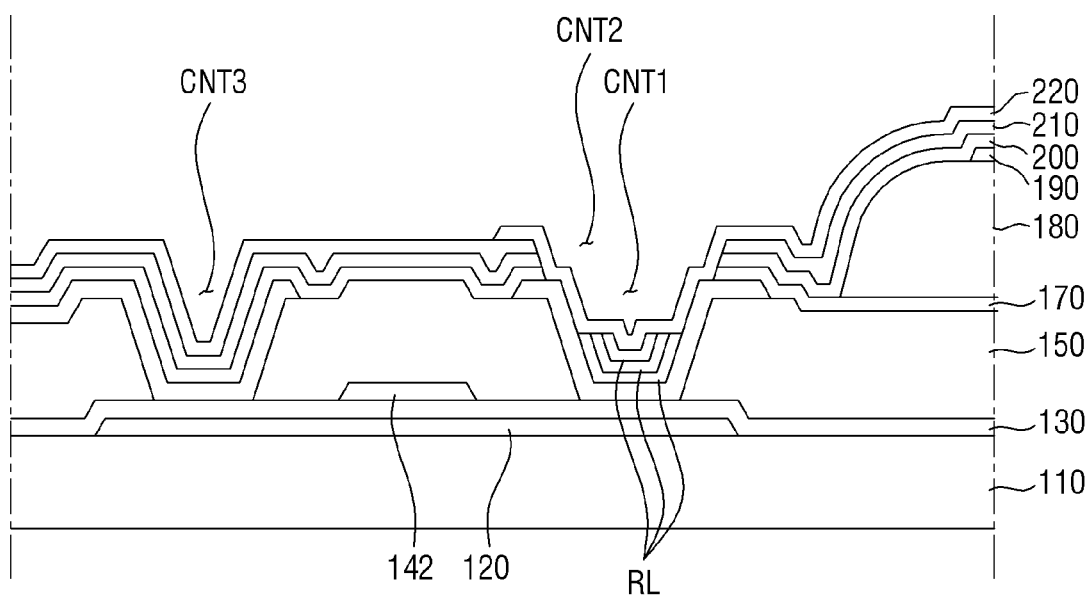

Thereafter, referring to FIG. 13, the pixel electrode 220 is provided, and is then electrically connected to the drain electrode 163.

Various shapes of residual layers RL may be formed in the first contact hole CNT1 depending on the degree of exposure performed on the photoresist PR during the formation of the second contact hole CNT2, and this will hereinafter be described.

Figure 14:
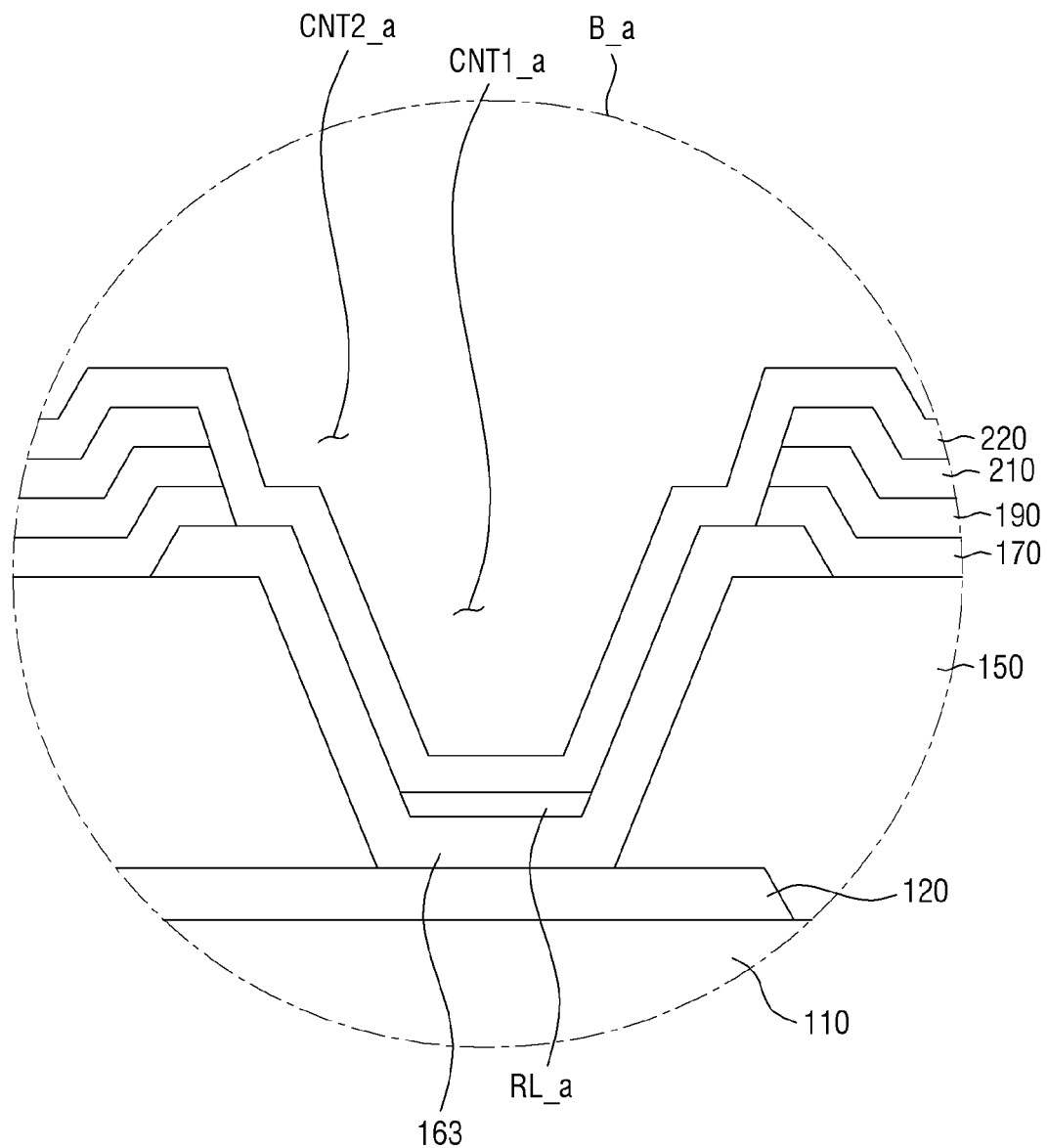
FIG. 14 is a cross-sectional view of an area of an LCD device according to an alternative exemplary embodiment of the disclosure, corresponding to the area B of FIGS. 2 and 3.

FIG. 14 is a cross-sectional view of an area B_a of an LCD device according to an alternative exemplary embodiment of the disclosure, corresponding to the area B of FIGS. 2 and 3.

Referring to FIG. 14, in such an embodiment, a residual layer RL_a differs from the residual layer RL of FIGS. 2 and 3 in the number of insulating layers included therein. In such an embodiment, the residual layer RL_a includes fewer insulating layers than the residual layer RL of FIGS. 2 and 3. The LCD device of FIG. 14 will hereinafter be described, focusing mainly on the residual layer RL_a, and descriptions of the other elements of the LCD device of FIG. 14 will be omitted or at least simplified since the LCD device of FIG. 14 may be substantially the same as those of the LCD device of FIGS. 1 through 4 except for the residual layer RL. In FIGS. 2, 3 and 14, like reference numerals indicate like elements.

In an exemplary embodiment, as shown in FIG. 14, the LCD device includes a first based substrate 110, a semiconductor layer 120, a first insulating layer 130, a drain electrode 163, a second insulating layer 150, a third insulating layer 170, a fourth insulating layer 190, and a pixel electrode 220.

A first contact hole CNT1_a is defined through the first insulating layer 130. The drain electrode 163 is disposed along the inner sidewalls of the first contact hole CNT1_a to be in physical contact with, and electrically connected to, the semiconductor layer 120 inside the first contact hole CNT1_a.

A second contact hole CNT2_a is defined through the second, third, and fourth insulating layers 150, 170, and 190. The pixel electrode 220 is disposed along the inner sidewalls of the second contact hole CNT2_a to be in physical contact with, and electrically connected to, the drain electrode 163 inside the second contact hole CNT2_a.

In an exemplary embodiment, as shown in FIGS. 2 and 3, portions of the first, second and third insulating layers 130, 150 and 170 are stacked in the residual layer RL. In an alternative exemplary embodiment, as shown in FIG. 14, only a portion of the first insulating layer 130 is stacked in the residual layer RL_a. The residual layer RL_a of FIG. 14 may be obtained by exposing photoresist (not illustrated) for forming the second contact hole CNT2_a for a longer period of time or more intensively than photoresist (not illustrated) for forming the second contact hole CNT2 of FIGS. 2 and 3 so that the amount of photoresist remained in the first contact hole CNT1_a may be smaller than the amount of photoresist remained in the first contact hole CNT1 of FIGS. 2 and 3.

The top of the residual layer RL_a may be flat. In an exemplary embodiment, the first, second and third insulating layers 130, 150, and 170 may all be stacked in the first contact hole CNT1_a, before the formation of the second contact hole CNT2_a, but later, the second and third insulating layers 150 and 170 may be completely removed from the first contact hole CNT1_a by an etching process for forming the second contact hole CNT2_a. As a result, the top of the residual layer RL_a may be planarized.

Figure 15:
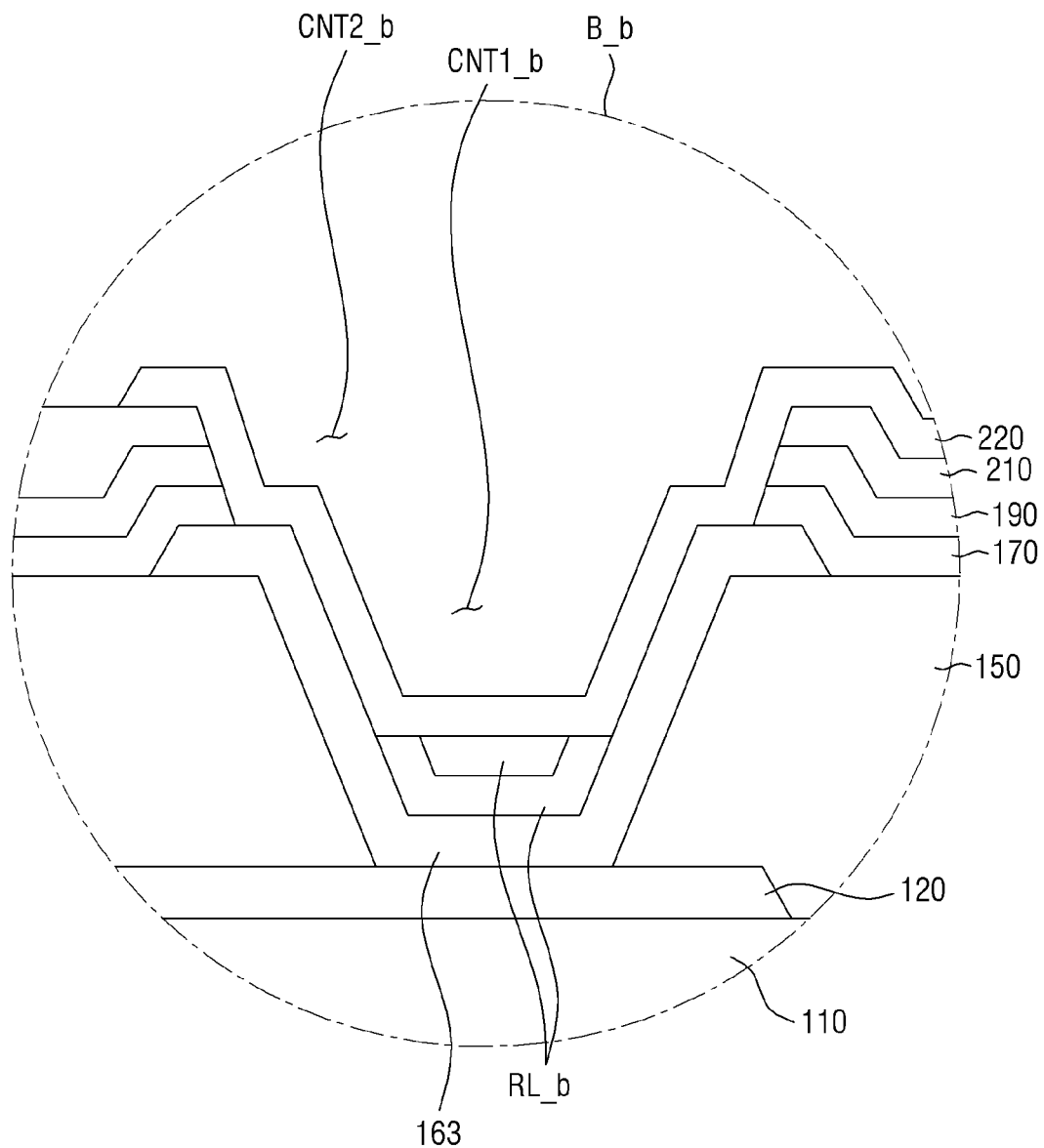
FIG. 15 is a cross-sectional view of an area of an LCD device according to another alternative exemplary embodiment of the disclosure, corresponding to the area B of FIGS. 2 and 3.

FIG. 15 is a cross-sectional view of an area B_b of an LCD device according to another alternative exemplary embodiment of the disclosure, corresponding to the area B of FIGS. 2 and 3.

Referring to FIG. 15, in such an embodiment, a residual layer RL_b differs from the residual layer RL of FIGS. 2 and 3 in the number of insulating layers included therein. In such an embodiment, the residual layer RL_b includes fewer insulating layers than the residual layer RL of FIGS. 2 and 3. The LCD device of FIG. 15 will hereinafter be described, focusing mainly on the residual layer RL_b, and descriptions of the other elements of the LCD device of FIG. 15 will be omitted or at least simplified since the LCD device of FIG. 15 may be substantially the same as those of the LCD device of FIGS. 1 through 4 except for the residual layer RL. In FIGS. 2, 3, and 15, like reference numerals indicate like elements.

An exemplary embodiment of the LCD device, as shown in FIG. 15, includes a first base substrate 110, a semiconductor layer 120, a first insulating layer 130, a drain electrode 163, a second insulating layer 150, a third insulating layer 170, a fourth insulating layer 190, and a pixel electrode 220.

In an exemplary embodiment, as shown in FIGS. 2 and 3, portions of the first, second, and third insulating layers 130, 150, and 170 are all stacked in the residual layer RL. In an alternative exemplary embodiment, as shown in FIG. 14, only a portion of the first insulating layer 130 is stacked in the residual layer RL_a. In another alternative exemplary embodiment, as shown in FIG. 15, portions of the first and second insulating layers 130 and 150 are stacked in the residual layer RL_a. In such an embodiment, the residual layer RL_b of FIG. 15 may be obtained by exposing photoresist (not illustrated) for forming a second contact hole CNT2_b for a longer period of time or more intensively than the photoresist for forming the second contact hole CNT2 of FIGS. 2 and 3 so that the amount of photoresist remained in a first contact hole CNT1_b may be smaller than the amount of photoresist remained in the first contact hole CNT1 of FIGS. 2 and 3. The residual layer RL_b of FIG. 15 may also be obtained by exposing the photoresist (not illustrated) for forming the second contact hole CNT2_b for a longer period of time or more intensively than the photoresist for forming the second contact hole CNT2_a of FIG. 14 so that the amount of photoresist remained in the first contact hole CNT1_b may be smaller than the amount of photoresist remained in the first contact hole CNT1_a of FIG. 14.

The top of the residual layer RL_b may be flat. Specifically, the first, second and third insulating layers 130, 150 and 170 may all be stacked in the first contact hole CNT1_b originally, before the formation of the second contact hole CNT2_b, and, thereafter, the third insulating layer 170 may be completely removed from the first contact hole CNT1_a by an etching process for forming the second contact hole CNT2_b. As a result, the top of the residual layer RL_b may be planarized.

Figure 16:
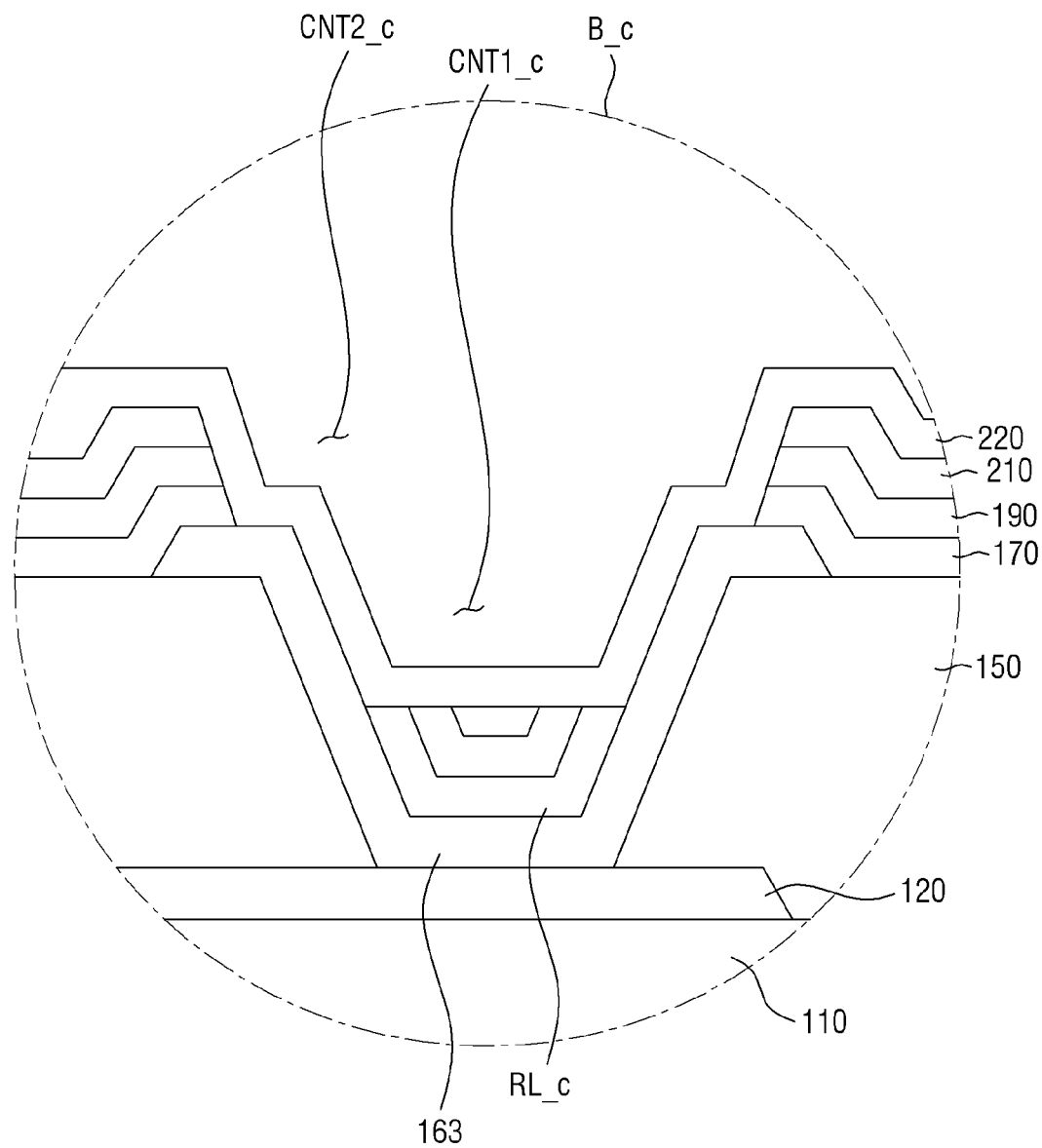
FIG. 16 is a cross-sectional view of an area of an LCD device according to another alternative exemplary embodiment of the disclosure, corresponding to the area B of FIGS. 2 and 3.

FIG. 16 is a cross-sectional view of an area B_c of an LCD device according to another alternative exemplary embodiment of the disclosure, corresponding to the area B of FIGS. 2 and 3.

Referring to FIG. 16, a residual layer RL_c differs from the residual layer RL of FIGS. 2 and 3 in that it has a flat top surface. The LCD device of FIG. 16 will hereinafter be described, focusing mainly on the residual layer RL_c, and descriptions of the other elements of the LCD device of FIG. 16 will be omitted or at least simplified since the LCD device of FIG. 16 may be substantially the same as those of the LCD device of FIGS. 1 through 4 except for the residual layer RL. In FIGS. 2, 3, and 16, like reference numerals indicate like elements.

In an exemplary embodiment, as shown in FIG. 16, the LCD device includes a first base substrate 110, a semiconductor layer 120, a first insulating layer 130, a drain electrode 163, a second insulating layer 150, a third insulating layer 170, a fourth insulating layer 190 and a pixel electrode 220.

In an exemplary embodiment, as shown in FIGS. 2 and 3, the residual layer RL has the first, second and third insulating layers 130, 150 and 170 stacked therein, and the top surface of the residual layer RL has a shape reflecting the slopes of the inner sidewalls of the first contact hole CNT1. In an alternative exemplary embodiment, as shown in FIG. 16, the residual layer RL_c has the first, second and third insulating layers 130, 150 and 170 stacked therein, and the top surface of the residual layer RL_c of FIG. 16 is flat.

In such an embodiment, the residual layer RL_c of FIG. 16 may be obtained by exposing photoresist (not illustrated) for forming a second contact hole CNT2_c for a longer period of time or more intensively than the photoresist for forming the second contact hole CNT2 of FIGS. 2 and 3 so that the amount of photoresist remained in a first contact hole CNT1_c may be smaller than the amount of photoresist remained in the first contact hole CNT1 of FIGS. 2 and 3. The residual layer RL_c of FIG. 16 may also be obtained by exposing the photoresist (not illustrated) for forming the second contact hole CNT2_c for a longer period of time or more intensively than the photoresist for forming the second contact hole CNT2_a or CNT2_b of FIG. 14 or 15 so that the amount of photoresist remained in the first contact hole CNT1_c may be smaller than the amount of photoresist remained in the first contact hole CNT1_a or CNT1_b of FIG. 14 or 15.

Figure 17:
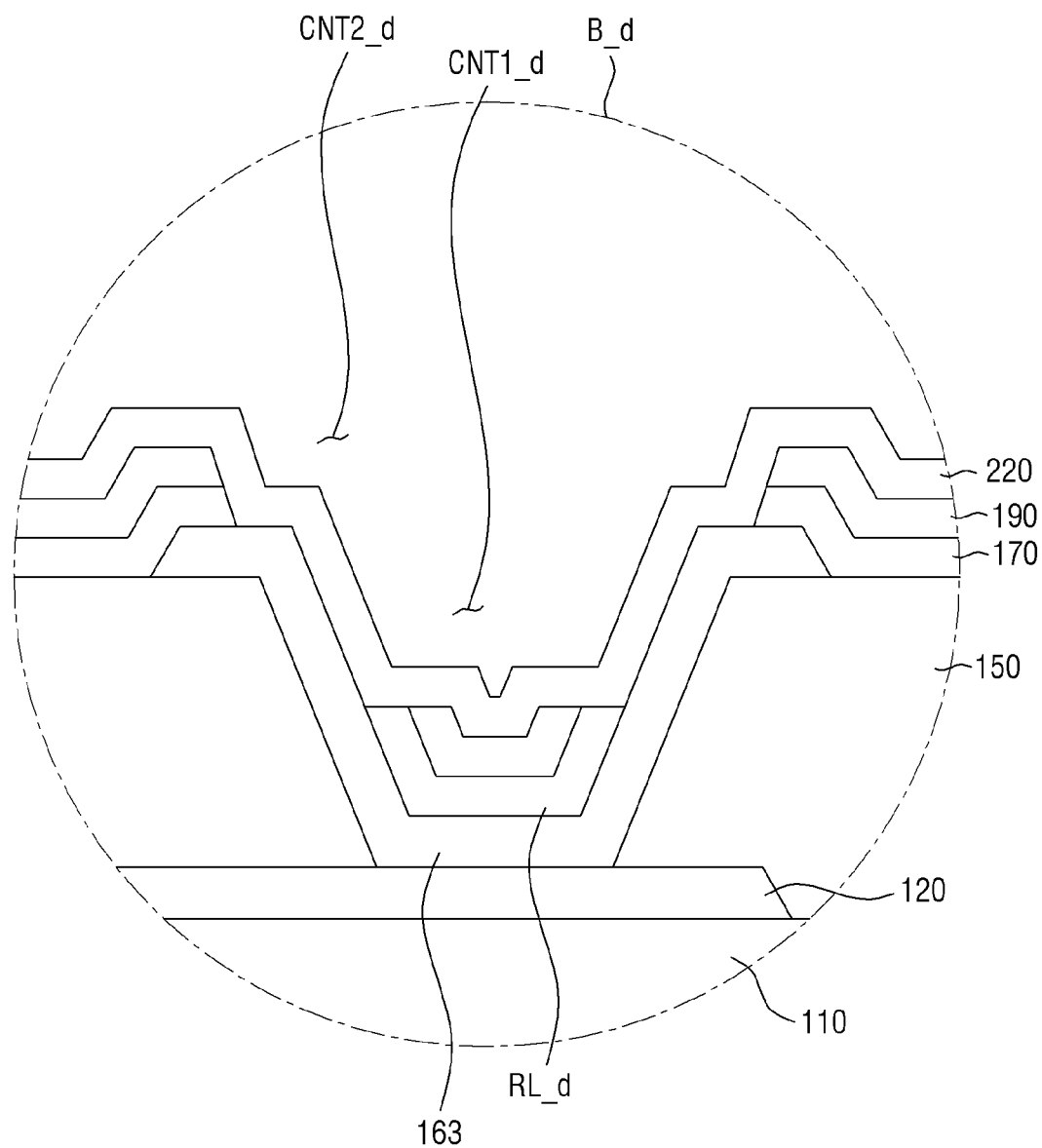
FIG. 17 is a cross-sectional view of an area of an LCD device according to another alternative exemplary embodiment of the disclosure, corresponding to the area B of FIGS. 2 and 3.

FIG. 17 is a cross-sectional view of an area B_d of an LCD device according to another alternative exemplary embodiment of the disclosure, corresponding to the area B of FIGS. 2 and 3.

Referring to FIG. 17, a residual layer RL_d differs from the residual layer RL of FIGS. 2 and 3 in the number of insulating layers disposed between a drain electrode 163 and a pixel electrode 220. Specifically, the number of insulating layers disposed between the drain electrode 163 and the pixel electrode 220 of FIG. 17 is smaller than the number of insulating layers disposed between the drain electrode 163 and the pixel electrode 220 of FIGS. 2 and 3. The LCD device of FIG. 17 will hereinafter be described, focusing mainly on the residual layer RL_d, and descriptions of the other elements of the LCD device of FIG. 17 will be omitted or at least simplified since the LCD device of FIG. 17 may be substantially the same as those of the LCD device of FIGS. 1 through 4 except for the residual layer RL. In FIGS. 2, 3, and 17, like reference numerals indicate like elements.

In an exemplary embodiment, as shown in FIG. 17, the LCD device includes a first base substrate 110, a semiconductor layer 120, a first insulating layer 130, a drain electrode 163, a second insulating layer 150, a third insulating layer 170, and a pixel electrode 220.

A first contact hole CNT1_d is defined through the first insulating layer 130. The drain electrode 163 is disposed along the inner sidewalls of the first contact hole CNT1_d to be in physical contact with, and electrically connected to, the semiconductor layer 120 inside the first contact hole CNT1_d.

A second contact hole CNT2_d is defined through the second and third insulating layers 150 and 170. The pixel electrode 220 is disposed along the inner sidewalls of the second contact hole CNT2_d to be in physical contact with, and electrically connected to, the drain electrode 163 inside the second contact hole CNT2_d.

In an exemplary embodiment, as shown in FIGS. 2 and 3, three insulating layers are disposed between the drain electrode 163 and the pixel electrode (i.e., between the first and second contact holes CNT1 and CNT2). In an alternative exemplary embodiment, as shown in FIG. 17, two insulating layers are disposed between the drain electrode 163 and the pixel electrode 220 (i.e., between the first and second contact holes CNT1_d and CNT2_d). In exemplary embodiments of the disclosure, multiple overlapping contact holes may be realized regardless of the number of insulating layers disposed therebetween.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A display device, comprising:
a substrate;
a semiconductor layer disposed on the substrate;
a first insulating layer disposed on the semiconductor layer and including a first opening;
a first conductive layer disposed on the first insulating layer and contacting with the semiconductor layer via the first opening;
a second insulating layer disposed on the first conductive layer and including a second opening; and
a second conductive layer disposed on the second insulating layer and contacting with the first conductive layer via the second opening,
wherein the second conductive layer contacts with the first conductive layer in the first opening, and
wherein the second insulating layer is disposed between the first conductive layer and the second conductive layer in a thickness direction of the substrate and disposed within the second opening.

2. The display device of claim 1, wherein the first conductive layer includes a bottom surface in physical contact with the semiconductor layer and a top surface bent outwardly from the other end of an inner side, and the second conductive layer is in physical contact along the inner side of the first conductive layer.

3. The display device of claim 2, wherein
the second conductive layer is in physical contact with the top surface of the first conductive layer.

4. The display device of claim 1, wherein the second opening overlaps a region where the first opening is disposed.

5. The display device of claim 1, wherein a width of the second opening is about 1.5 micrometers or less.

6. The display device of claim 1, further comprising:
a third insulating layer disposed on the second conductive layer and including a third opening; and
a third conductive layer disposed on the third insulating layer and contacting with the second conductive layer via the third opening,
wherein, the third conductive layer contacts with the second conductive layer in the second opening.

7. A display device, comprising:
a substrate;
a semiconductor layer disposed on the substrate;
a first insulating layer disposed on the semiconductor layer and including a first opening;
a first conductive layer disposed on the first insulating layer and contacting with the semiconductor layer via the first opening;
a second insulating layer disposed on the first conductive layer and including a second opening;
a second conductive layer disposed on the second insulating layer and contacting with the first conductive layer via the second opening; and
a residual layer that is a part of the second insulating layer is disposed on the top surface of the first conductive layer,
wherein, the second conductive layer contacts with the first conductive layer in the first opening.

8. The display device of claim 7, wherein the second conductive layer is disposed on the residual layer.

9. The display device of claim 7, wherein the residual layer is in physical contact with the bottom surface of the first conductive layer and the second conductive layer, respectively.

10. A display device, comprising:
a substrate;
a semiconductor layer disposed on the substrate;
a first insulating layer disposed on the semiconductor layer and including a first opening;
a first conductive layer disposed on the first insulating layer and contacting with the semiconductor layer via the first opening;
a second insulating layer disposed on the first conductive layer and including a second opening;
a second conductive layer disposed on the second insulating layer and contacting with the first conductive layer via the second opening; and
a residual layer that is a part of the second insulating layer is disposed on the top surface of the first conductive layer,
wherein the second conductive layer contacts with the first conductive layer in the first opening,
wherein the second insulating layer includes first through n-th sub-insulating layers, and
the first through k-th sub-insulating layers are disposed in the residual layer, wherein n is a natural number, and k is a natural number less than or equal to n.

11. The display device of claim 10, wherein a stacking order of the first through k-th sub-insulating layers inside the residual layer is the same as a stacking order of the first through k-th sub-insulating layers in the second insulating layer outside the first opening.

12. The display device of claim 10, wherein a top of the residual layer is not flat.

13. The display device of claim 12, wherein the residual layer comprises the first through n-th sub-insulating layers, which are stacked one on another.

14. A display device, comprising:
a substrate;
a first conductive layer disposed on the substrate;
a first insulating layer disposed on the first conductive layer and including a first opening;
a second conductive layer disposed on the first insulating layer and contacting with the first conductive layer via the first opening,
a second insulating layer disposed on the second conductive layer and including a second opening; and
a third conductive layer disposed on the second insulating layer and contacting with the second conductive layer via the second opening, which is defined through the second insulating layer,
wherein the third conductive layer contacts with the second conductive layer in the first opening, and
wherein the second insulating layer is disposed between the second conductive layer and the third conductive layer in a thickness direction of the substrate and within the second opening.

15. The display device of claim 14, wherein the second conductive layer includes a bottom surface in physical contact with the first conductive layer and a top surface bent outwardly from the other end of an inner side of the second conductive layer, and the third conductive layer is in physical contact along the inner side of the second conductive layer.

16. A display device, comprising:
a substrate;
a first conductive layer disposed on the substrate;
a first insulating layer disposed on the first conductive layer and including a first opening;
a second conductive layer disposed on the first insulating layer and contacting with the first conductive layer via the first opening,
a second insulating layer disposed on the second conductive layer and including a second opening;
a third conductive layer disposed on the second insulating layer and contacting with the second conductive layer via the second opening, which is defined through the second insulating layer;
a third insulating layer disposed on the third conductive layer and including a third opening; and
a fourth conductive layer disposed on the third insulating layer and contacting with the third conductive layer via the third opening,
wherein the third conductive layer contacts with the second conductive layer in the first opening, and
wherein the fourth conductive layer contacts with the third conductive layer in the third opening.

\* \* \* \* \*